US009035166B2

(12) United States Patent
Hagelstein et al.

(10) Patent No.: US 9,035,166 B2
(45) Date of Patent: May 19, 2015

(54) METHOD AND APPARATUS FOR THERMAL ENERGY-TO-ELECTRICAL ENERGY CONVERSION

(75) Inventors: Peter L. Hagelstein, Carlisle, MA (US); Dennis M. Wu, Kowloon (HK)

(73) Assignee: MTPV Power Corporation, Austin, TX (US)

(*) Notice: Subject to any disclaimer, the term of this patent is extended or adjusted under 35 U.S.C. 154(b) by 740 days.

(21) Appl. No.: 12/821,698

(22) Filed: Jun. 23, 2010

(65) Prior Publication Data

US 2011/0011434 A1     Jan. 20, 2011

Related U.S. Application Data

(63) Continuation of application No. 11/500,062, filed on Aug. 7, 2006, now abandoned.

(51) Int. Cl.
*H01L 35/32* (2006.01)
*H01L 35/00* (2006.01)
*H01J 45/00* (2006.01)

(52) U.S. Cl.
CPC .............. *H01L 35/00* (2013.01); *H01J 45/00* (2013.01)

(58) Field of Classification Search
CPC .................................. H01L 35/00; H01J 45/00
USPC ................................................ 136/202–242
See application file for complete search history.

(56) References Cited

U.S. PATENT DOCUMENTS 5,470,395 A    11/1995   Yater et al.
6,084,173 A     7/2000   DiMatteo

OTHER PUBLICATIONS

Hagelstein, P.J. and Y. Kucherov, "Research on Thermal Diodes for Thermal to Electric Conversion", Pub. 2005, RLE Group Progress Report 147, Chapter 33 Energy Production and Conversion, pp. 1-6.
Hagelstein, P.J. and Wu, Dennis, "Thermal to Electric Conversion with a Novel Quantum-Coupled Converter", Pub. 2009, RLE Progress Report 148, Chapter 34 Thermal to Electric Conversion with a Novel Quantum-Coupled Converter, pp. 1-21.
Narayanaswamy A., Shen, S., Hu, L., Chen, X. and Chen, G,, "Breakdown of the Planck blackbody radiation law at nanoscale gaps", Pub. 2009, Applied Physics A, vol. 96, pp. 357-362.
Shen, S., Narayanaswamy, A., and Chen, G., "Surface phonon polariton mediated energy transfer between nanoscale gaps", Pub. 2009, Nano Letters, vol. 9, pp. 2909-2913.

*Primary Examiner* — Keith Hendricks
*Assistant Examiner* — Kourtney S Carlson
(74) *Attorney, Agent, or Firm* — Taylor Russell & Russell, P.C.

(57) ABSTRACT

An improved method and apparatus for thermal-to-electric conversion involving relatively hot and cold juxtaposed surfaces separated by a small vacuum gap wherein the cold surface provides an array of single charge carrier converter elements along the surface and the hot surface transfers excitation energy to the opposing cold surface across the gap through Coulomb electrostatic coupling interaction.

57 Claims, 5 Drawing Sheets

METHOD AND APPARATUS FOR THERMAL ENERGY-TO-ELECTRICAL ENERGY CONVERSION

This application is a continuation-in-part of U.S. patent application Ser. No. 11/500,062 filed on Aug. 7, 2006. U.S. patent application Ser. No. 11/500,062 is incorporated herein by reference.

BACKGROUND

The present invention relates generally to the conversion of thermal energy to electric energy, being more particularly concerned with such conversion as affected by gap-separated juxtaposed hot-side radiator and cold-side charged carrier converter structures. The present invention is a novel combination of coherent excitation transfer through electrostatic coupling between a relatively hot-side surface and a small-gap-separated juxtaposed cold-side converter surface, wherein the latter is of a novel single-carrier cold side converter construction.

The implementation of practical devices through fabrication by now well-known solid-state chip manufacturing technologies is now achievable, promising thermal-to-electric converter arrays of this character offering high power potential.

SUMMARY

In summary, from one of its viewpoints, the invention embraces a method of converting thermal to electric energy, that comprises, juxtaposing relatively cold-side conversion and relatively hot-side surfaces separated by a small gap; providing lower state electrons on or near the cold surface; Coulomb-coupling the lower state electrons to charges on the hot surface; transferring energy from the hot-side surface to said cold-side surface lower state electrons to excite them to a higher state; collecting the higher state electrons at or near the cold surface to generate a higher potential; and extracting the converted electric energy in response to said higher potential. The juxtaposed surfaces are positioned and/or adjusted to be sufficiently close in the surface electric field such that the dipole interaction there between is dominated by Coulomb interaction which transfers energy in the conversion directly by quantum state element (well, wire or dot) interactions along the cold surface.

In its structure or device aspect, the invention embodies in a thermal-to-electric conversion apparatus, relatively hot and cold juxtaposed surfaces separated by a small gas or vacuum gap, the cold surface providing a chip array of single charge carrier converter elements, and the hot surface electrostatically transferring excitation energy to the opposing cold surface converter elements across the gap through Coulomb electrostatic coupling interaction. The gap may be a vacuum gap, however the gap should not comprise a solid or liquid. It may be a gas, and more preferably, it may be a diluted gas with the electron mean-free-path longer than the gap separation.

It is thus a primary object of the invention to provide a new and improved thermal-to-electric energy conversion method and novel apparatus or device structure utilizing the same, embodying an improved hot surface and a juxtaposed relatively cold converter surface separated by a small gap. It is thus a primary object of the invention to provide a new and improved quantum-coupled single electron thermal-to electric energy conversion method and novel apparatus or device structure utilizing the same, functioning as a refrigerator where the load is a power source providing energy into a system to cool the cold-side and to heat the hot-side. In refrigeration mode, power is applied to the quantum dot structure cold side. The electrostatic coupling draws thermal power from the hot side. The quantum element structures may be heat sunk to maintain their temperature. The hot side may be cooled to a lower temperature or thermal power is extracted when the hot side is at an elevated temperature.

A further object is to provide such an apparatus and method employing novel excitation transfer through electrostatic coupling between the relatively hot and cold surfaces together with a new single-carrier cold-side converter chip-like structure.

Still another object is to provide novel chip arrays of such structures.

The invention discloses a thermal-to-electric conversion apparatus comprising a relatively hot surface and a relatively cold surface juxtaposed and separated by a gap selected from the group consisting of a vacuum gap and a gas gap. The cold surface carries a chip array of pairs of closely adjacent single-level and higher-level excitation quantum state elements that serve as an array of single-charge carrier converter elements. The hot surface electrostatically transfers excitation energy to the juxtaposed cold surface converter elements across the gap with the juxtaposed surfaces adjusted to be sufficiently close in a near surface electric field that the dipole interaction there between is dominated by a Coulomb electrostatic coupling interaction whereby the Coulomb interaction transfers the thermal energy in the conversion directly by quantum state element interactions along the cold surface. The apparatus further provides that the gap between the hot surface and the cold surface may be adjusted to be sufficiently small so as to minimize the effects of transverse photon generation relative to the amount of thermal energy transferred by Coulomb-coupling interactions. The converted power per unit area is improved as the gap becomes smaller at very small distances due to Coulomb-coupling interactions. The amount of power converted per unit area is important since it fundamentally impacts the cost of power conversion. In order to maximize the Coulomb-coupled energy transfer, the gap between the hot surface and the cold surface may also be adjusted to be very small.

The apparatus further comprises an electron from a first electron reservoir that is introduced into a lower level excitation state of each of the converter elements on the cold surface, and then Coulomb-couples across the gap to a carrier charge on the hot surface, producing a quantum correlation there between that leads to excitation transfer from the hot surface to the cold surface that promotes said electron to a higher level excitation state. The apparatus of further comprises that the excited higher level state electron thereupon tunnels to a second cold-surface electron reservoir maintained at an elevated potential relative to said first reservoir, and an electrical load is connected between the reservoirs and driven by the current caused by the promoted electron(s). The apparatus may promote only a single type carrier charge is at a time. The single carrier charge may be either electrons or holes, that is, one or the other but not both.

The converter elements may comprise an array of semiconductor elements that are chip-integrated along the cold surface in a matrix substrate and interconnected by a network, selected from the group consisting of electron reservoir conductors and buses, interleaved within the chip substrate to provide the appropriate connections, selected from the group consisting of series and parallel connections, amongst and between the elements of the array. The arrays of said respective first and second electron reservoir conductors and buses in the array may be commonly connected to opposite sides of said load. The semi-conductor elements may be of InSb material and/or $Ga_{0.31}In_{0.69}$ Sb material or of other materials, including but not limited to cadmium selenide (CdSe), cadmium sulfide (CdS) and cadmium telluride (CdTe) and the like. The material of the hot surface may be selected from the group consisting of flat metal, metallic copper, semi-metal, and highly doped semiconductor material. The election reservoir conductors and buses may be of doped n-type InSb. The chip matrix substrate on the cold side may be GaSb. Other materials, including but not limited to cadmium selenide, cadmium sulfide and cadmium telluride and the like may be used. The hot surface may be about 1300K and the relatively cold surface may be about 300K. However, if the hot surface is to contain quantum elements (dots, wires or wells) the hot surface temperature will need to be lower than 1300K. For higher temperature operation (at or near 1300K) the surface could be an unstructured flat surface comprising materials such as aluminum oxide and the like. The carrier converter elements may be in the form of an array of one or more of semi-conductor elements of varied geometry, selected from the group consisting of dots, bars, semi-conductor short cylinders, semi-conductor short wires, and small sheets providing quantum wells integrated within the chip substrate. The semi-conductor elements and the interconnecting network may be integrated in the substrate, with some oriented parallel to the cold surface, and some oriented horizontally and/or vertically oriented to the cold surface. The dimensions of the dots or bars may be of the order of about 10 to 120 Å.

The invention also comprises a method of converting thermal to electric energy by juxtaposing relatively cold-side conversion and relatively hot-side radiating surfaces separated by a small gap, providing lower state electrons on or near the cold surface, Coulomb-coupling the lower state electrons to the carrier charges on the hot surface, transferring heat from the hot-side surface through the Coulomb coupling to said cold-side surface lower-state electrons to excite them to a higher state, collecting the higher state electrons at or near the cold surface to generate a higher potential and extracting the resulting converted electric energy in response to said higher potential. The conversion cold-side surface comprises an array of interconnected converter elements each having respective quantum wells supporting the lower and higher electron states, and maintained at a ground potential. The collecting of the higher state electrons is effected by tunneling between such ground wells and higher potential wells on the cold side. The converter elements are caused to promote only a single type of carrier charge at a time. The single carrier type charge is one of either electrons or holes.

The thermal-to-electric conversion apparatus comprises relatively hot and cold juxtaposed surfaces separated by a small vacuum gap. The gap may range from less than 0.05 microns (50 nanometers) with a lower limit as small as practically possible such as 0.001 microns (1 nanometer). An array, selected from the group consisting of interconnected quantum elements, may be provided at the cold surface. The quantum elements may be disposed in pairs of 1-excitation level and 2-excitation level quantum element. An array, selected from the group consisting of interspersed grounded higher voltage reservoirs and buses, may be connected to the respective quantum elements of each pair and interconnected through a load. The quantum elements may be selected from the group consisting of quantum dots and quantum wells. Each 1-excitation level quantum dot of the pair may be positioned adjacent the 2-excitation level quantum dot of the pair to allow for tunneling. One of the electron reservoirs and buses may be grounded and the electron excited in the adjacent 2-excitation level well and dot may subsequently tunnel into the 1-excitation level well and dot. The invention may further comprise a set of reservoirs and busses connected to a higher voltage than ground so that electrons excited through Coulomb energy transfer subsequently tunnel in to the 1-excitation level quantum well and dot before relaxing into the higher voltage bus to do work on the load. The electric fields established between the electrons on the hot and cold sides may be such that excitation transfer occurs across the gap. The quantum elements may have various dimensions, in one embodiment quantum elements may have dimensions 10 Angstroms while in other embodiments may range to 120 Angstroms but they may also be larger. The single level quantum elements may have various dimensions, in various embodiments they may range from about 10 to about 100 Angstroms but may also be larger. The 1-excitation level quantum dot may be made of $Ga_{0.31}In_{0.69}Sb$. Quantum elements may be made of various materials, including but not limited to cadmium selenide, cadmium sulfide and cadmium telluride and the like. In one embodiment, the distance between the quantum well dots may be of the order of about 100 Angstroms. In one embodiment, the electron reservoirs or busses may be positioned about 50 Angstroms from the quantum dots at or near the cold surface but other larger and smaller distances between the quantum elements are possible.

The invention further comprises a method of converting thermal-to-electric energy comprising juxtaposing relatively cold-side conversion and relatively hot-side radiating surfaces separated by a small gap; providing lower state electrons along the cold surface in an array of 1-excitation level quantum elements positioned next to an interleaving array of 2-excitation level quantum elements to allow for tunneling there between; grounding an adjacent bus array to provide an electron for the ground states of the 2-excitation level quantum elements; promoting an electron to an excited state in the 2-excitation level quantum elements by Coulomb energy transfer from the hot-side; and permitting the excited electrons subsequently to tunnel into the corresponding 1-excitation level quantum elements before relaxing into any array of higher voltage reservoirs or busses to do work on a load connected between the array of buses.

The invention also comprises a method of converting thermal-to-electric energy of juxtaposing a relatively hot surface and a relatively cold surface and separating the surfaces by a small gap, selected from the group consisting of a vacuum gap and a gas gap; carrying a chip array of pairs on the cold surface of closely adjacent single-level and higher-level excitation quantum state elements that serve as an array of single-charge carrier converter elements; electrostatically transferring excitation energy from the hot surface to the juxtaposed cold surface converter elements across the gap; adjusting the juxtaposed surfaces to be sufficiently close in a near surface electric field that the dipole interaction there between is dominated by a Coulomb electrostatic coupling interaction whereby the Coulomb interaction transfers the thermal energy in the conversion directly by quantum state element interactions along the cold surface.

The thermal-to-electric conversion apparatus also comprises relatively hot and cold juxtaposed surfaces separated by a small vacuum or gas gap. The cold surface provides a chip array of single charge carrier converter elements. The hot surface electrostatically transfers excitation energy to the opposing cold surface converter elements across the gap through Coulomb electrostatic coupling interaction.

Other and further objects will be described hereinafter and will be more particularly pointed out in connection with the appended claims. Preferred designs and embodiments, including a best mode design, are hereinafter more fully presented.

The invention disclosed herein is, of course, susceptible of embodiment in many different forms. Shown in the drawings and described herein below in detail are preferred embodiments of the invention. It is to be understood, however, that the present disclosure is an exemplification of the principles of the invention and does not limit the invention to the illustrated embodiments.

BRIEF DESCRIPTION OF THE DRAWINGS

These and other features, aspects and advantages of the present invention will become better understood with regard to the following description and accompanying drawings wherein.

DETAILED DESCRIPTION

Figure 1:
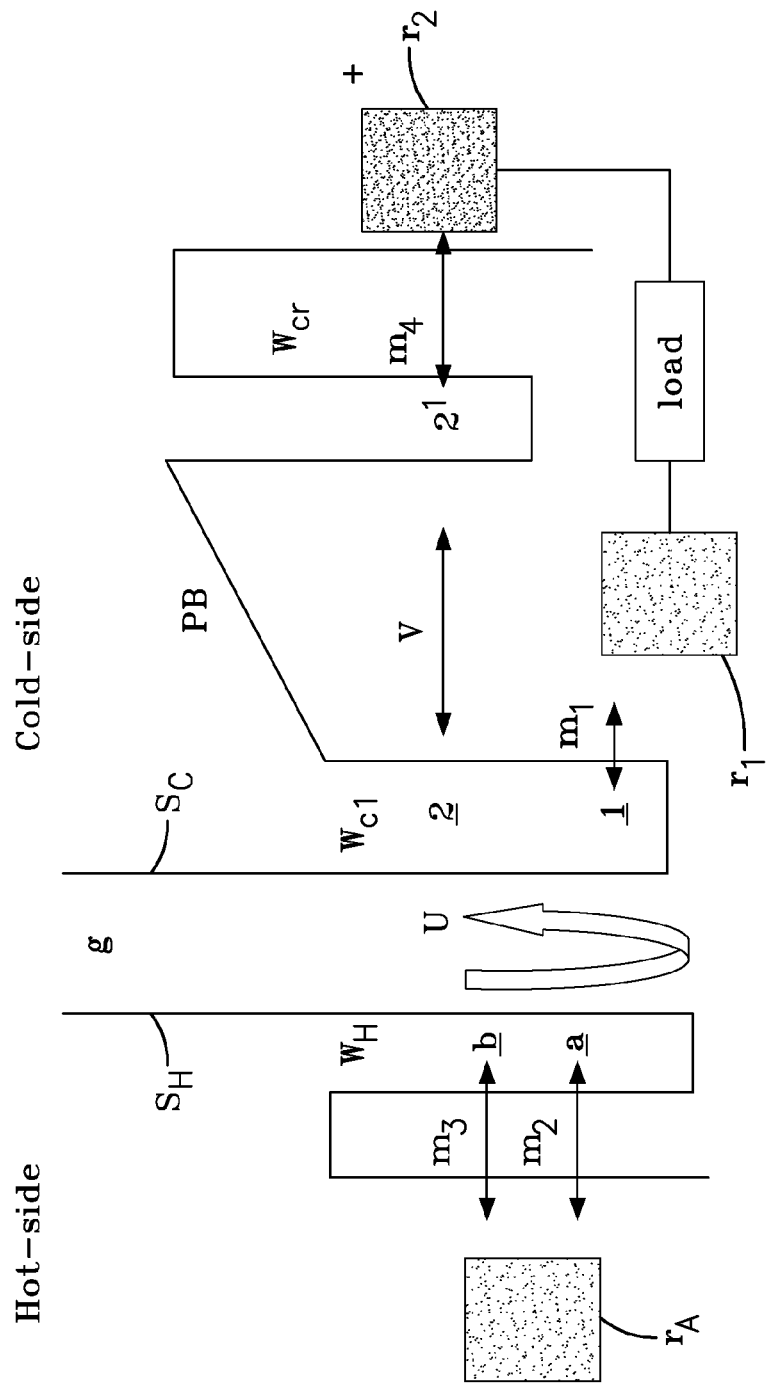
FIG. 1 of which is a basic schematic diagram of an idealized conception underlying the invention.

Turning first to the roadmap of our said FIG. 1, this involves an idealized theoretical explanatory scheme consisting of a hot-side surface $S_H$ and a juxtaposed cold-side carrier charge-to-electricity converter surface $S_C$ separated by a small vacuum gap g. On the cold side, there is schematically shown a first quantum well $W_{C1}$ having a lower electron potential level 1 and an upper level 2 and wherein an electron is introduced or supplied into the lower level or state 1 from a source of electrons called a reservoir $r_1$, which may be at relative ground potential. As later explained, in practical implementation, the well $W_{C1}$ may be inherently provided in a quantum dot, such as an appropriate semi-conductor dot, and the electron reservoir $r_1$ may be a conductor of a conducting network interconnecting such dots in an array or matrix of dots distributed along the cold-side $S_C$ as later more fully described in connection with the embodiments of FIGS. 2 and 3.

Electrostatic coupling to charges on the hot side surface $S_H$ produces a quantum-correlation. This appears schematically in FIG. 1 as a well $W_H$ with two levels connected to an electron reservoir $r_a$. As an electron is supplied from the cold-side reservoir $r_1$ to the cold-side level 1 of the well $W_{C1}$, accordingly, Coulomb electrostatic coupling between that electron and a charge on the hot side produces a quantum correlation between the cold side electron and such carrier, providing electrostatic interaction U that leads to excitation energy transfer from the hot side to the cold side, thereby elevating the electron in the cold-side well $W_{C1}$ up to higher potential level or state 2, as indicated by the upward arrow portion shown below the symbol U. From this upper state 2, the electron may tunnel, as shown schematically at V, through a potential barrier PB to a matched level $2^1$ in a second quantum dot well $W_{cr}$ on its way to a second reservoir $r_2$ which is at elevated voltage relative to ground, as schematically illustrated at +. The well $W_{cr}$ permits only one level—level $2^1$. The two cold-side reservoirs $r_1$ and $r_2$ are connected together through an electrical load, so-labeled. Thus, when elections are promoted in the first quantum well $W_{C1}$, they have the possibility of tunneling to the second well $W_{cr}$ and then continuing on to do electrical work before ending up in the first reservoir $r_1$ at ground.

The levels of the hot-side relax to an electron reservoir $r_A$ comprising a continuum of excitation levels, wherein the level "a" is coupled to each level in the reservoir with matrix element $m_2$ and $m_3$.

Electric fields between an electron on the hot side well $W_H$ and an electron on the cold side, couple the product states $|b>|1>$ and $|a>|2>$ with coupling U such that excitation transfer can occur across the gap g. Level 1 of the well $W_{C1}$, in turn, relaxes to reservoir $r_1$ with matrix element $m_1$ and level $2^1$ of well $W_{cr}$ relaxes to reservoir $r_2$ with matrix element $m_4$.

In Coulomb-coupling energy is transferred from a hot-side electron to a cold-side electron through the Coulomb force between the two electrons. The basic mechanism of the device is that high temperature on the hot side results in excited electrons in the hot-side image, with excitation transferred via electrostatic interaction coupling U (between the hot-side charge, which is itself coupled to excited electrons and phonon modes, and the cold-side electron) to promote a cold-side electron from level 1 to level 2 in well $W_{C1}$. The invention of FIG. 1 can also functions as a refrigerator where the load is a power source providing energy into the system to cool the cold-side down and to heat up the hot-side.

In summary, thus, an electron reservoir on the cold side supplies an electron to a lower state; and coupling with the hot side causes the electron to be promoted to an excited state, and then the electron proceeds to a second electron reservoir at elevated potential. An electrical load connected between the two reservoirs can be driven from the electrical current caused by the promoted electrons. Such a scheme can work with either electrons or holes. We have called it a "single carrier converter" since, in accordance with the invention, it is only a single carrier that is promoted at a time (either an electron or a hole but not both), as opposed to a photovoltaic in which electron-hole pairs are created and photon exchange coupling occurs, namely an electron on the hot side emits a photon and an electron on the cold side accepts the photon. This photon exchange coupling is in contrast to Coulomb coupling. The magnitude of the photon exchange coupling and the Coulomb coupling have different distance dependencies (that is, the distance between the hot-side and the cold-side) where Coulomb coupling has a $1/R^3$ dependence on distance while the photon exchange coupling has a $1/R$ dependence. Coulomb coupling dominates over the photon exchange coupling at narrow distances roughly shorter than the wavelength corresponding to the energy separation of the cold-side single level and higher level excitation quantum state elements divided by $2\pi$ a or at distances roughly shorter than $\lambda/2\pi$. At larger distances, the Coulomb coupling decays rapidly.

Figure 2:
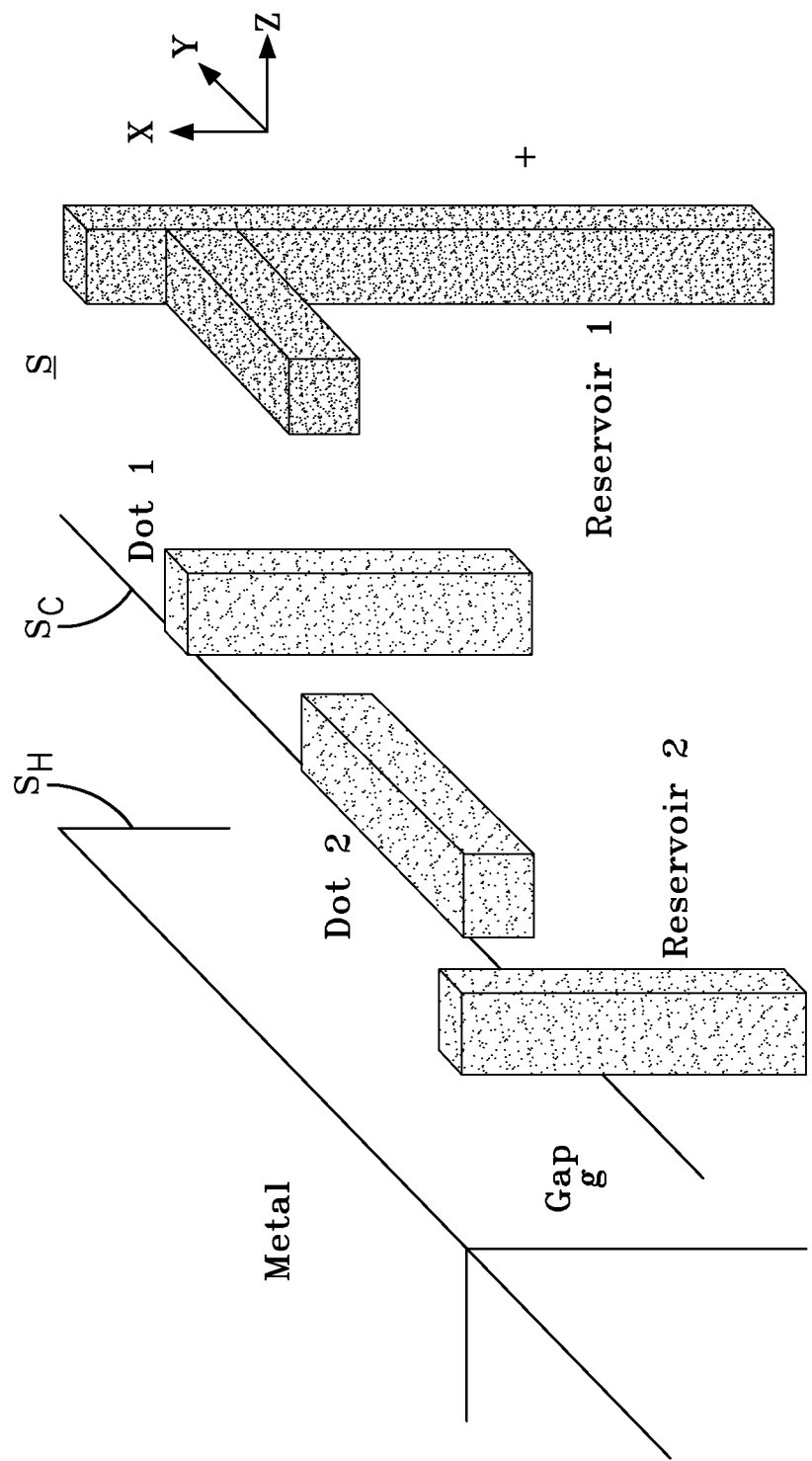
FIG. 2 is an expanded isometric schematic view of a preferred device for practicing the methodology of the invention embodying solid state conversion arrays as implementation.

FIG. 2 presents an exploded view of a preferred physical structure of a thermal-electric converter constructed in accordance with the invention to operate in accordance with the methodology thereof as outlined in FIG. 1. As before explained, the cold-side surface $S_c$ of the device is shown juxtaposed to the hot-side heat emitter surface $S_H$ with a small vacuum gap g there between. The cold-side converter comprises an array of appropriate semi-conductor small elements or dots, two of which are shown as "Dot 1" and "Dot 2", implemented as by well-known chip technology and in a chip substrate matrix schematically illustrated by S. In practice, these semi-conductor converter dots may assume any desired geometry, such as the rectangular boxes or bar elements shown, supporting and serving as quantum-confined electron energy excitation state wells ($W_{C1}$ and $W_{cr}$ FIG. 1) along (at or near) the surface $S_c$. Other forms of these semi-conductor elements may include small cylinders or wires, small quantum-well sheets or even molecules. The array of dot elements or the like will be conductor-interconnected, as earlier mentioned by, a network of conductors feeding and outputting electrons to and from the respective elements (reservoir $r_1$, $r_2$, etc. in FIG. 1) interconnecting the array of dot elements in series and/or in parallel fashion, as appropriate, and also formed into the substrate matrix S of the converter chip side of the device. In the device of FIG. 2, moreover, segments of these electron "reservoir" conductors are shown at "Reservoir 1" ($r_1$ in FIG. 1) and at "Reservoir 2" ($r_2$ in FIG. 1) as rectangular cross-section bus portions.

In accordance with the invention, in an appropriately dimensioned structure, the charge in the quantum dot on the cold side surface $S_c$ will couple to a charge on the nearby conductive hot-side surface $S_H$, providing a coupling to surface currents, resulting in the two-level system model of the invention herein presented.

In the device of FIG. 2, the hot side surface $S_H$ may accordingly be a simple flat surface comprising aluminum oxide or a metal, semi-metal or highly doped semiconductor. The metal surface has surface charges and the charges act as an effective dipole with zero energy separation that is coupled to thermally excited electrons and phonons. Across the gap g, the cold-side is shown as comprising the before-mentioned two quantum dots on the surface $S_C$; Dot 1 having two levels (well $W_{C1}$ of FIG. 1) and they couple to the hot-side dipole via the electrostatic Coulomb coupling interaction before described. Dot 2 has one level (in well $W_{cr}$ of FIG. 1) and it couples to the excited upper level of Dot 1 (state 2 in well $W_{C1}$ of FIG. 1) through the tunneling (V). The lower level of Dot 1 (level 1 in well $W_{C1}$), as before stated, relaxes to the ground voltage conductor Reservoir 1 ($r_1$ in FIG. 1). The Dot 2 level relaxes to conductor Reservoir 2 which is at the elevated voltage +. Reservoir conductor 1 is shown having a horizontal branch bus portion extending from the vertical leg of the bus conductor in order to couple the lower level of Dot 1, the branch being oriented horizontally to Dot 1 and facing the center of Dot 1, with a distance. Reservoir conductor 2 is shown parallel to Dot 1 and it runs parallel along the surface $S_C$ next to Dot 2, with a distance. Where desired, these dot and conductor elements may also be oriented at other angles, including substantially perpendicular to the plane of the surface $S_C$.

The converter elements may comprise an array of semiconductor elements that are chip-integrated along the cold surface in a matrix substrate and interconnected by a network of electron reservoir conductors or buses, interleaved within the chip substrate to provide the appropriate series and/or parallel connections amongst and between the elements of the array.

Figure 3:
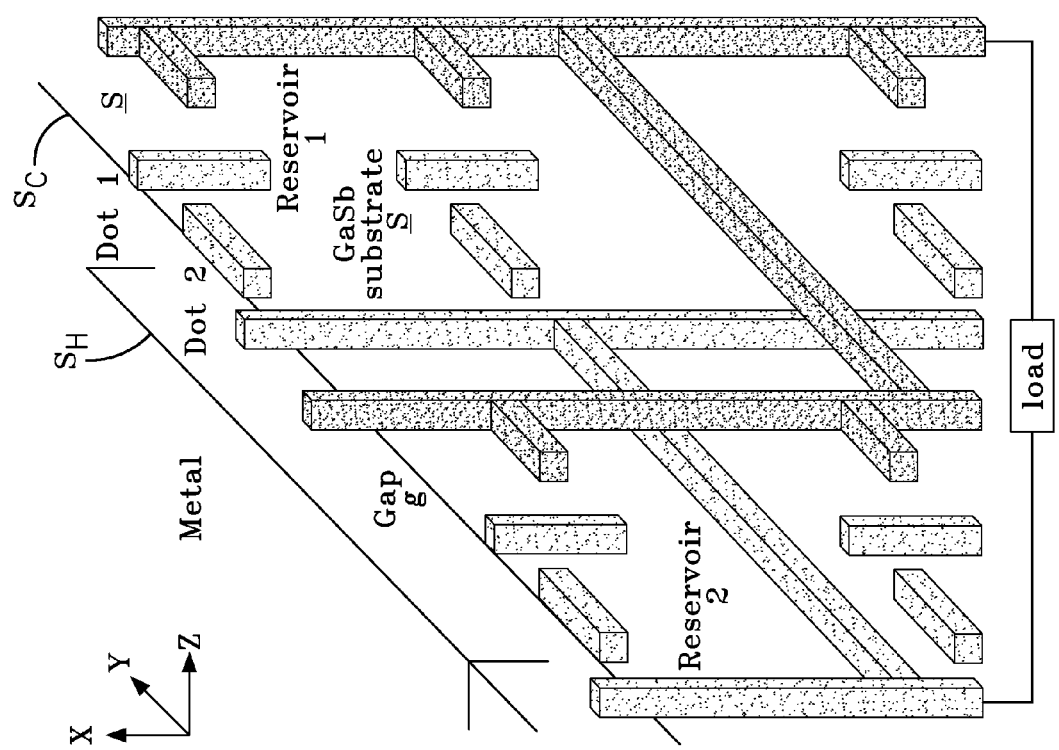
FIG. 3 is a similar diagram of such an array of the novel thermal-to-electric converter elements of the type shown in FIG. 2.

The cold-side structure is repeated as an array over the surface $S_C$ as shown in FIG. 3, with the Reservoir 1 conductor buses linked together, and the Reservoir 2 conductor buses linked together, and within Reservoirs 1 and 2 connected through the load as in FIG. 1.

In one embodiment, a simulated specific structural design of this implementation, we obtained the following exemplary results. The temperature on the hot-side is 1300K, and that on the cold-side, 300K. Dot 1 has x×y×z dimension 120 Å×100 Å×100 Å and is of the preferred material InSb. The energy separation of the Dot 1 levels is 0.2 eV. The relaxation time of InSb at 0.2eV is 1. ps. The hot-side is metallic copper, in this equipment, of which relaxation time at 0.2 eV is 0.57 fs. In one embodiment, Dot 2 has dimension 50 Å×100 Å×100 Å and is horizontally pointing to the top part of Dot 1. (FIG. 2 is not drawn to scale). Dot 2 is of material $Ga_{0.31}In_{0.69}Sb$ but may also be comprised of other materials as described herein. The distance between Dot 1 and Dot 2 is 100 Å. Reservoir 1 branch is horizontally positioned 50 Å away from the center of Dot 1. Reservoir 2 is located 50 Å next to Dot 2. Both reservoirs are preferably made up of n-type InSb doped such that its relaxation time at 0.2 eV is 10 ps. The relaxation time for an n-type InSb with doping level $3×10^{17}$ cm$^{-3}$ at 0.2 eV is 52 ps, and it is expected that the relaxation time will decrease to zero as the doping increases, since this is the behavior at DC. Therefore there exists a doping level with any desired relaxation time. The surrounding matrix material substrate on the cold side may be GaSb. In other embodiments, the quantum element dimensions, spacing there between and materials may differ as described herein.

Electrostatic interaction increases with smaller vacuum gap thickness. Radiative heat transport occurs between the hot and cold region, however, if two surfaces are close together, the amount of useful power transferred from the hot to cold side increases much more rapidly because of the effects of Coulomb coupling. In a vacuum, Coulomb coupling dominates over photon contribution by the absorption wavelength in the divided by $2\pi$. For example, the absorption wavelength corresponding to 0.2 eV is 6.2 µm, and hence the gap should be below about 1 µm for that case in a vacuum. in the calculations, Coulomb coupling dominates below about 500 Angstroms because of the dielectric constants. Therefore if the gap between the hot surface and the cold surface is sufficiently small, the effects of transverse photon generation are minimized relative to the amount of thermal energy transferred by the Coulomb interaction. The converted power per unit area is improved as the gap becomes smaller at very small distances due to Coulomb-coupling interactions. The amount of power converted per unit area is important since it fundamentally impacts the cost of power conversion. If the gap between the hot surface and the cold surface is sufficiently small the converted power per unit area will be increased due to Coulomb-coupling interactions. Gaps below 50-100 nanometers with a lower limit as small as practically possible such as 1 nanometer may facilitate the maximization of the amount of thermal energy transferred by the Coulomb interaction.

Figure 4:
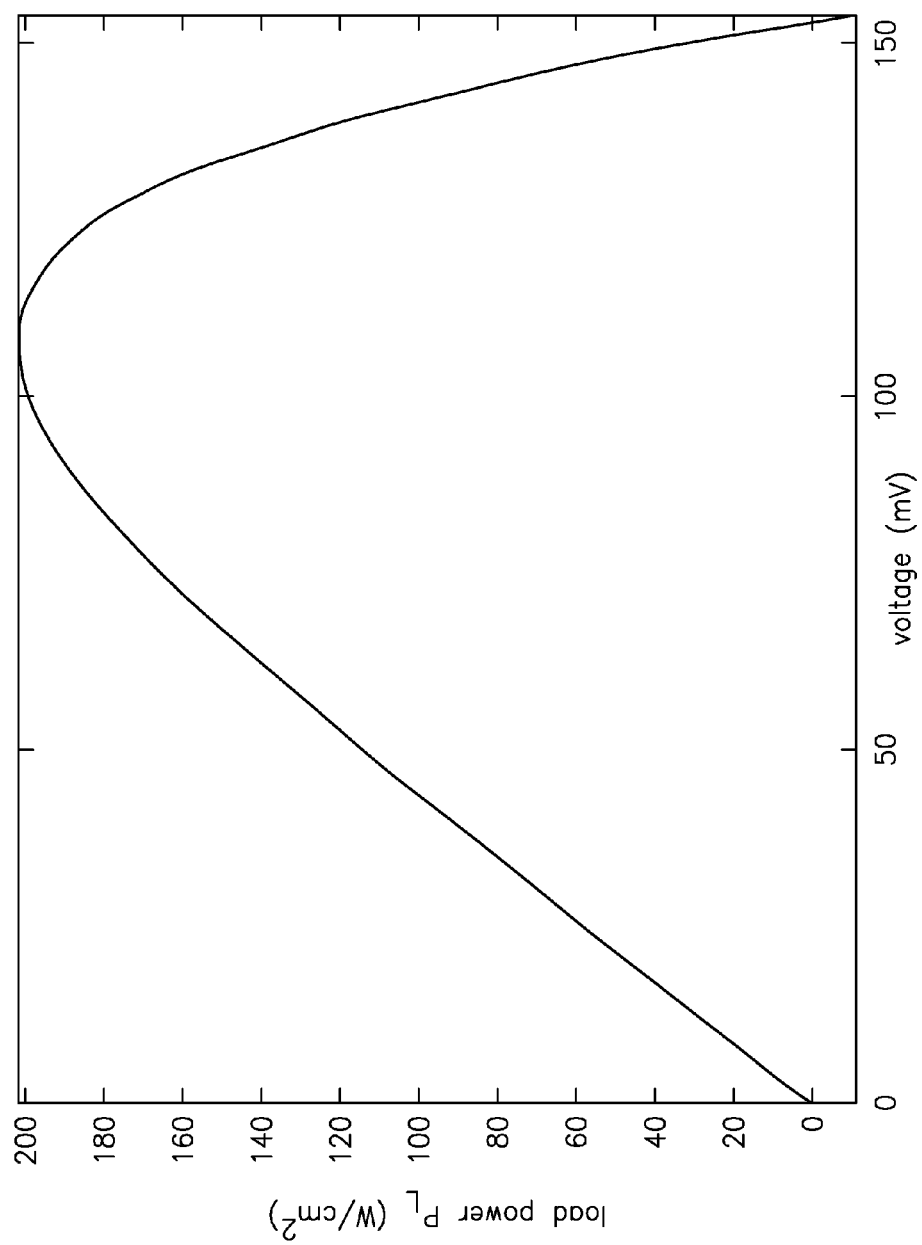
FIGS. 4 and 5 are respective load power density and efficiency of performance graphs attainable with such an embodiment of the invention.
Figure 5:
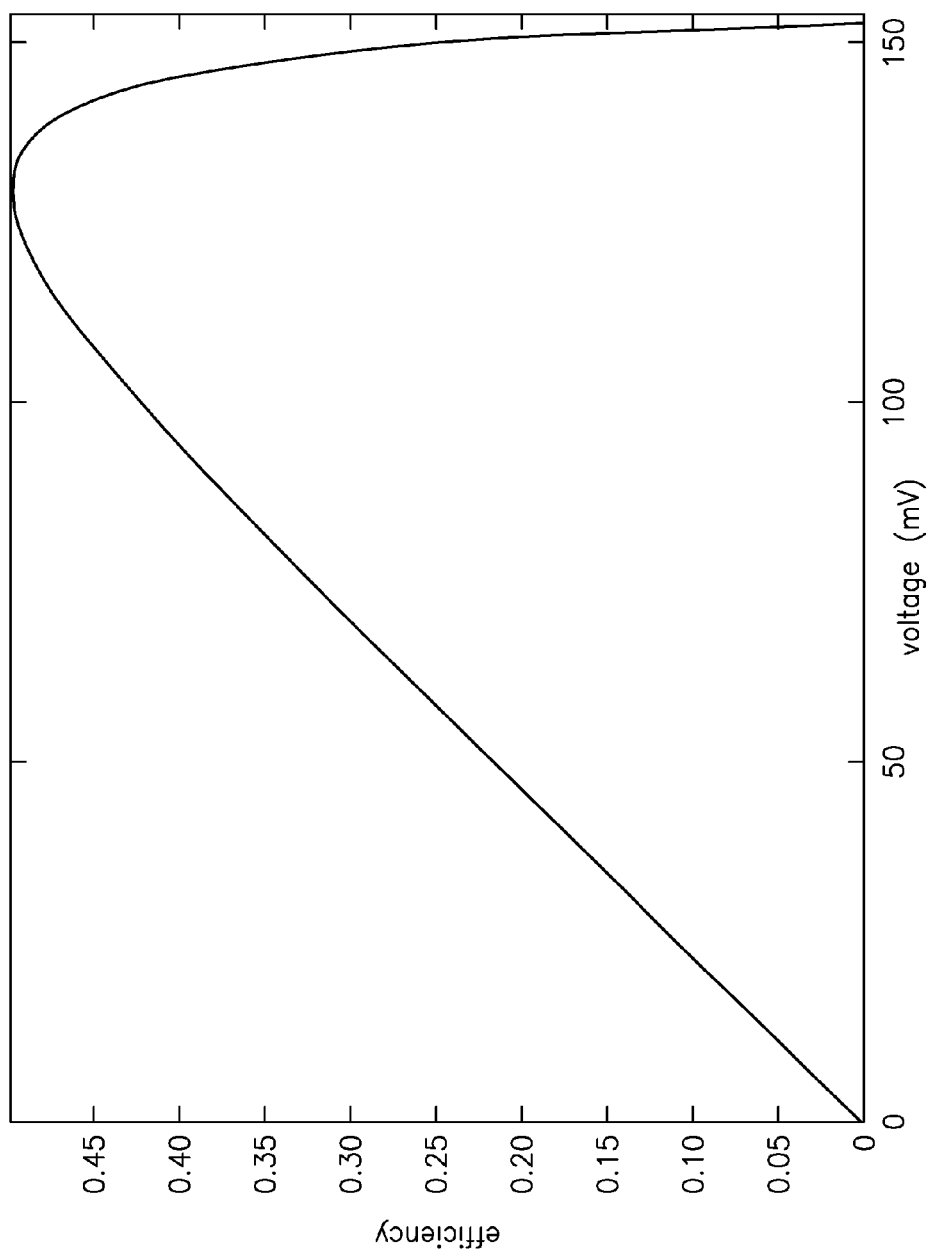

Shown in FIG. 4 and FIG. 5 are the power on load density and efficiency, respectively, as a function of voltage for the device. An initial estimate for maximum power per unit active area is 202 W/cm$^2$ occurring at voltage 107 mV. FIG. 5 shows that the maximum efficiency 49.8% occurs at voltage 129 mV.

While the invention has been described with references to its preferred embodiment, it will be understood by those skilled in the art that various changes may be made and equivalents may be substituted for elements thereof without departing from the true spirit and scope of the invention. In addition, many modifications may be made to adapt a particular situation or material to the teaching of the invention without departing from its essential teachings.

What is claimed is:
1. A thermal-to-electric conversion apparatus comprising:
a relatively hot surface ($S_H$) juxtaposed with a relatively cold surface ($S_C$) and separated by a gap (g) in the range of from 1 nanometer to 100 nanometers;
the relatively hot surface ($S_H$) includes a hot side quantum well ($W_H$) having an upper energy level (b) and a lower energy level (a), the hot side quantum well ($W_H$) connected to a hot side reservoir ($r_A$) of single charged carriers;

the relatively cold surface ($S_C$) includes an array of converter elements, each converter element comprising a first cold side quantum well ($W_{C1}$) having an upper energy level (2) and a lower energy level (1), and a second cold side quantum well ($W_{Cr}$) having a single energy level ($2^1$);

the first cold side quantum well ($W_{C1}$) is connected to a first cold side reservoir ($r_1$) being maintained at relative ground potential, and the second quantum well ($W_{Cr}$) is connected to a second cold side reservoir ($r_2$);

a first single charge carrier from the hot side reservoir ($r_A$) in the hot side quantum well ($W_H$) is elevated by thermal energy from a lower energy level (a) to an upper energy level (b) and Coulomb couples to a second single charge carrier from the first cold side reservoir ($r_1$) in the first cold side quantum well ($W_{C1}$);

the elevated first single charge carrier from the hot side reservoir ($r_A$) in the hot side quantum well ($W_H$) relaxes from an upper energy level (b) to a lower energy level (a) as the second single charge carrier from the first cold side reservoir ($r_1$) in the first cold side quantum well ($W_{C1}$) is elevated from the lower energy level (1) to the upper energy level (2) of the first cold side quantum well ($W_{C1}$) maintained at relative ground potential;

the second elevated single charge carrier tunnels through a potential barrier (PB) to the second cold side quantum well ($W_{Cr}$) and is received by a second cold side reservoir ($r_2$) maintained at an elevated potential (+); and an electrical load is connected between the second cold side reservoir ($r_2$) and the first cold side reservoir ($r_1$), driven by a current created by the movement of single charge carriers from the second cold side reservoir ($r_2$) to the first cold side reservoir ($r_1$).

2. The thermal-to-electric conversion apparatus of claim 1 wherein the gap between the relatively hot surface and the relatively cold surface is minimized in the range between 1 nanometer and 100 nanometers to increase the amount of energy transferred across the gap by Coulomb coupling relative to the amount of energy transferred by transverse photon generation.

3. The thermal-to-electric conversion apparatus of claim 2 wherein the gap between the relatively hot surface and the relatively cold surface is adjusted to be less than about 50 nanometers.

4. The thermal-to-electric conversion apparatus of claim 2 wherein the gap between the relatively hot surface and the relatively cold surface is adjustable.

5. The thermal-to-electric conversion apparatus of claim 1 wherein a single type carrier charge is promoted at a time.

6. The thermal-to-electric conversion apparatus of claim 5 wherein the single carrier charge is selected from the group consisting of electrons and holes.

7. The thermal-to-electric conversion apparatus of claim 1 wherein the converter elements comprise an array of semiconductor elements that are chip-integrated along the relatively cold surface in a matrix substrate and interconnected by a network wherein the network is selected from the group consisting of conductors between multiple first cold side reservoirs and conductors between multiple second cold side reservoirs, positioned within the chip substrate to provide the appropriate connections between the elements of the array.

8. The thermal-to-electric conversion apparatus of claim 7 wherein the first cold-side reservoir conductors and second cold side reservoir conductors in the array are connected to opposite sides of said electrical load.

9. The thermal-to-electric conversion apparatus of claim 7 wherein the semi-conductor elements are selected from the group consisting of InSb, $Ga_{0.31}In_{0.69}Sb$, cadmium selenide, cadmium sulfide and cadmium telluride material.

10. The thermal-to-electric conversion apparatus of claim 7 wherein the material of the relatively hot surface is selected from the group consisting of aluminum oxide, flat metal, metallic copper, semi-metal, and highly doped semiconductor material.

11. The thermal-to-electric conversion apparatus of claim 7 wherein the cold side reservoir conductors are of doped n-type InSb.

12. The thermal-to-electric conversion apparatus of claim 7 wherein the chip matrix substrate on the cold side is selected from the group consisting of GaSb, cadmium selenide, cadmium sulfide and cadmium telluride material.

13. The thermal-to-electric conversion apparatus of claim 7 wherein the relatively hot surface temperature is about 1300K and the relatively cold surface is about 300K.

14. The thermal-to-electric conversion apparatus of claim 7 wherein the single charge carrier converter elements are in the form of an array of one or more of semi-conductor elements of varied geometry, selected from the group consisting of dots, bars, semi-conductor short cylinders, semi-conductor short wires and small sheets, providing quantum wells integrated within the chip substrate.

15. The thermal-to-electric conversion apparatus of claim 14 wherein the semi-conductor elements and the interconnecting network are integrated in the substrate, with some oriented parallel to the relatively cold surface, and some oriented horizontally and vertically oriented to the relatively cold surface.

16. The thermal-to-electric conversion apparatus of claim 14 wherein dimensions of the dots and bars are of the order of about 10 to 120 Angstroms.

17. The thermal-to-electric conversion apparatus of claim 1 wherein the gap is selected from the group consisting of a vacuum gap and a gas gap.

18. The thermal-to-electric conversion apparatus of claim 1 wherein the apparatus functions as a refrigerator wherein the electrical load is a power source load.

19. The thermal-to-electric conversion apparatus of claim 1 wherein the gap between the relatively hot surface and the relatively cold surface is sufficiently small so as to increase converted power per unit area due to Coulomb-coupling interactions.

20. The apparatus of claim 1, where the juxtaposed relatively hot surface and relatively cold surface are adjusted to be sufficiently close such that the dipole interaction therebetween is dominated by Coulomb electrostatic interaction.

21. The apparatus of claim 1, further comprising adjusting the gap between the juxtaposed relatively hot surface and relatively cold surface to be sufficiently small to minimize the effects of transverse photon generation relative to the amount of energy transferred by Coulomb coupling interaction.

22. The apparatus of claim 1, wherein the relatively hot surface temperature is about 1300° K and the relatively cold surface temperature is about 300° K.

23. The apparatus of claim 22, wherein the relatively hot surface temperature is less than 1300° K to enable functionality of quantum elements on the relatively hot surface.

24. The apparatus of claim 1, wherein the first cold side quantum well and the second cold side quantum well are quantum elements selected from the group consisting of quantum dots, bars and wires having dimensions of between 10 and 120 Angstroms.

25. The apparatus of claim 1, wherein an array of one energy level cold side quantum wells is positioned next to an interleaving array of two energy level cold side quantum wells to allow for tunneling therebetween.

26. The apparatus of claim 1, wherein the first cold side quantum well is a first quantum dot that has dimensions of 120 Angstroms by 100 Angstroms by 100 Angstroms, is comprised of InSb and has energy separation of the energy levels therein of 0.2 electron volts.

27. The apparatus of claim 1, wherein the second cold side quantum well is a second quantum dot that has dimensions of 50 Angstroms by 100 Angstroms by 100 Angstroms, and is comprised of GaInSb.

28. The apparatus of claim 1, wherein the first cold side quantum well is a first quantum dot and the second cold side quantum well is a second quantum dot, the first quantum dot being separated from the second quantum dot by 100 Angstroms.

29. The apparatus of claim 28, wherein the first cold side reservoir is positioned 50 Angstroms from the first quantum dot and the second cold side reservoir is positioned 50 Angstroms from the second quantum dot.

30. The apparatus of claim 1, wherein the relatively hot surface is selected from the group consisting of aluminum oxide, flat metal, metallic copper, semi-metal, and highly doped semiconductor material.

31. A thermal-to-electric conversion apparatus comprising:
   a. relatively hot surface ($S_H$) and relatively cold surface ($S_C$) juxtaposed and separated by a small vacuum or gas-filled gap (g) in a 1 to 100 nanometer range;
   b. an array, including interconnected quantum elements and associated reservoirs, provided at the relatively cold surface ($S_C$);
   c. the quantum elements being disposed in multiple pairs of closely adjacent single charge converter elements including a first cold side quantum element ($W_{C1}$) having two excitation level quantum states (1, 2) and a second cold side quantum element ($W_{Cr}$) having a single excitation level quantum state ($2^1$), the multiple quantum element pairs serving as an arrangement of single charge carrier converter elements, wherein a single charge carrier in each interconnected first cold side quantum element ($W_{C1}$) is elevated by Coulomb interaction with a charge carrier in a hot side quantum element ($W_{Cr}$) on the relatively hot surface ($S_H$) from a lower excitation level (1) to a higher excitation level (2) in a first cold side quantum element ($W_{C1}$), and tunnels through a potential barrier (PB) from a relative ground potential to an excitation level ($2^1$) of the second cold side quantum element ($W_{Cr}$) maintained at an elevated potential (+) to an electrical load; and
   d. the array, further includes interspersed relative grounded reservoirs ($r_1$) and elevated potential reservoirs ($r_2$) and buses, having a connection to the respective quantum elements of each single charge converter element pair and interconnected through a load.

32. The thermal-to-electric conversion apparatus of claim 31 wherein the quantum elements are selected from the group consisting of quantum dots, quantum wires and quantum wells.

33. The thermal-to-electric conversion apparatus of claim 31 wherein each 1-excitation level quantum element of the pair is maintained at an elevated potential and positioned adjacent to the 2-excitation level quantum element of the pair to allow for tunneling therebetween.

34. The thermal-to-electric conversion apparatus of claim 31 wherein the first cold side quantum element and associated buses are relatively grounded and a single charge carrier excited to the higher excitation level of the first cold side quantum element subsequently traverses into the excitation level of the second cold side quantum element.

35. The thermal-to-electric conversion apparatus of claim 34 further comprising a set of reservoirs and busses connected to a higher potential than relative ground so that electrons excited through Coulomb energy transfer subsequently tunnel to the excitation level of the second cold side quantum element before relaxing into the higher voltage reservoir and bus connected to the load.

36. The thermal-to-electric conversion apparatus of claim 35 wherein the reservoirs and busses are positioned about 50 Angstroms from the quantum elements at or near the relatively cold surface.

37. The thermal-to-electric conversion apparatus of claim 35 wherein the quantum elements have dimensions of between about 120 Angstroms and about 10 Angstroms.

38. The thermal-to-electric conversion apparatus of claim 37 wherein the single level quantum element has dimensions from about 10 to about 120 Angstroms.

39. The thermal-to-electric conversion apparatus of claim 34 wherein electric fields are established between single charge carriers on the hot side and cold side such that electrostatic excitation transfer occurs across the gap.

40. The thermal-to-electric conversion apparatus of claim 31 wherein the second cold side quantum element is selected from the group consisting of $Ga_{0.31}In_{0.69}Sb$, cadmium selenide, cadmium sulfide and cadmium telluride.

41. The thermal-to-electric conversion apparatus of claim 31 wherein the distance between the quantum elements is less than 100 Angstroms.

42. A thermal-to-electric conversion apparatus comprising one or more converter elements, each converter element comprising:
   a relatively hot surface ($S_H$) juxtaposed in relation to a relatively cold surface ($S_C$), the relatively hot surface ($S_H$) and the relatively cold surface ($S_C$) separated by a gap (g) of between 1 nanometer and 100 nanometers;
   a hot side charge carrier introduced ($m_2$) into a hot side quantum well ($W_H$) from a hot side reservoir ($r_A$) and elevated from a lower potential energy level (a) to an upper potential energy level (b) by thermal energy;
   a first quantum well ($W_{C1}$) having a lower potential energy level (1) and an upper potential energy level (2) is positioned at or near the relatively cold surface ($S_C$);
   a single charge carrier introduced into the lower potential energy level (1) of the first quantum well ($W_{C1}$) on or near the relatively cold surface ($S_C$) from a first cold side reservoir ($r_1$);
   excitation energy transfer by Coulomb electrostatic coupling between the hot side charge carrier in the hot side quantum well ($W_H$) and the single charge carrier, wherein the single charge carrier is elevated from the lower potential energy level (1) to the upper potential energy level (2) in the first quantum well ($W_{C1}$) and the hot side charge carrier relaxes from the upper potential energy level (b) to the lower potential energy level (a) in the hot side quantum well ($W_H$);
   the single charge carrier at the upper potential energy level (2) in the first quantum well ($W_{C1}$) tunnels through a potential barrier (PB) to a second quantum well ($W_{Cr}$) at an upper potential energy level ($2^1$) and is received by a second cold side reservoir ($r_2$) maintained at an elevated potential (+) relative to a potential of the first cold side reservoir; and
   the single charge carrier passes through an electrical load from the second cold side reservoir ($r_2$) to the first cold side reservoir ($r_1$), wherein the single charge carrier in the first cold side reservoir ($r_1$) is at the lower potential energy level (1).

43. The apparatus of claim 42, wherein the first cold side reservoir is at relative ground potential.

44. The apparatus of claim 42, wherein the first quantum well and second quantum well comprise single charge carrier quantum dots.

45. The apparatus of claim 42, wherein the first cold side reservoir is a conductor of a conducting network interconnecting multiple first quantum wells in an array of first quantum wells distributed along the relatively cold surface.

46. The apparatus of claim 42, wherein the single charge carrier is selected from the group consisting of holes and electrons.

47. The apparatus of claim 42, where the juxtaposed relatively hot surface and relatively cold surface are adjusted to be sufficiently close in a near surface electric field such that the dipole interaction therebetween is dominated by Coulomb electrostatic interaction.

48. The apparatus of claim 47, further comprising adjusting the gap between the juxtaposed relatively hot surface and relatively cold surface to be sufficiently small to minimize the effects of transverse photon generation relative to the amount of energy transferred by Coulomb coupling interaction.

49. The apparatus of claim 42, wherein the relatively hot surface temperature is about 1300° K and the relatively cold surface temperature is about 300° K.

50. The apparatus of claim 49, wherein the relatively hot surface temperature is less than 1300° K to enable functionality of quantum elements on the relatively hot surface.

51. The apparatus of claim 42, wherein the first quantum well and the second quantum well are quantum elements selected from the group consisting of quantum dots, bars and wires having dimensions of between 10 and 120 Angstroms.

52. The apparatus of claim 42, wherein an array of one energy level quantum elements is positioned next to an interleaving array of two energy level quantum elements to allow for tunneling therebetween.

53. The apparatus of claim 42, wherein the first quantum well is a first quantum dot that has dimensions of 120 Angstroms by 100 Angstroms by 100 Angstroms, is comprised of InSb and has energy separation of the potential energy levels therein of 0.2 electron volts.

54. The apparatus of claim 42, wherein the second quantum well is a second quantum dot that has dimensions of 50 Angstroms by 100 Angstroms by 100 Angstroms, and is comprised of GaInSb.

55. The apparatus of claim 42, wherein the first quantum well is a first quantum dot and the second quantum well is a second quantum dot, the first quantum dot being separated from the second quantum dot by 100 Angstroms.

56. The apparatus of claim 55, wherein the first cold side reservoir is positioned 50 Angstroms from the first quantum dot and the second cold side reservoir is positioned 50 Angstroms from the second quantum dot.

57. The apparatus of claim 42, wherein the relatively hot surface is selected from the group consisting of aluminum oxide, flat metal, metallic copper, semi-metal, and highly doped semiconductor material.

* * * * *